(12) United States Patent
Kampschreur et al.

(10) Patent No.: US 8,474,680 B2
(45) Date of Patent: Jul. 2, 2013

(54) WIREBONDING METHOD AND APPARATUS

(75) Inventors: Thomas M. Kampschreur, Arnhem (NL); Joep Stokkermans, Nijmegen (NL); Arjan F. Bakker, Helenaveen (NL); Piet C. J. Van Rens, Asten (NL); Arnoldus J. C. B. De Vet, Moerdijk (NL); Piet Van Der Meer, Breda (NL)

(73) Assignee: Invensas Corporation, San Jose, CA (US)

( * ) Notice: Subject to any disclaimer, the term of this patent is extended or adjusted under 35 U.S.C. 154(b) by 648 days.

(21) Appl. No.: 12/506,065

(22) Filed: Jul. 20, 2009

(65) Prior Publication Data
US 2009/0277950 A1 Nov. 12, 2009

Related U.S. Application Data

(63) Continuation of application No. 10/538,281, filed as application No. PCT/IB03/05244 on Nov. 17, 2003, now Pat. No. 7,578,425.

(30) Foreign Application Priority Data

Dec. 18, 2002 (EP) ..................................... 02080360

(51) Int. Cl.
*B23K 31/00* (2006.01)

(52) U.S. Cl.
USPC ........ 228/4.5; 228/213; 228/44.7; 228/180.5; 198/736; 269/42; 269/63; 269/56

(58) Field of Classification Search
USPC .................. 193/736; 269/42, 63, 56; 228/213, 228/4.5, 44.7, 180.5; 198/736
See application file for complete search history.

(56) References Cited

U.S. PATENT DOCUMENTS

| 5,307,978 | A | * | 5/1994 | Ricketson et al. | ............. 228/4.5 |
| 6,062,459 | A | * | 5/2000 | Sabyeying | ..................... 228/4.5 |

* cited by examiner

*Primary Examiner* — Keith Walker
*Assistant Examiner* — Erin Saad
(74) *Attorney, Agent, or Firm* — Lerner, David, Littenberg, Krumholz & Mentlik, LLP

(57) ABSTRACT

A method and apparatus are discloses for wirebonding leads of a plurality of lead frames being part of a lead frame assembly by a wirebonding tool to semiconductor products mounted on the respective lead frames. The semiconductor products are clamped by a clamping mechanism comprising a stationary clamp and a movable clamp. The movable clamp follows the indexing movement of the lead frame assembly during wirebonding of the semiconductor products clamped by the movable clamp. The wirebonding process does not need to be interrupted for the indexing.

6 Claims, 6 Drawing Sheets

WIREBONDING METHOD AND APPARATUS

Figure 1:
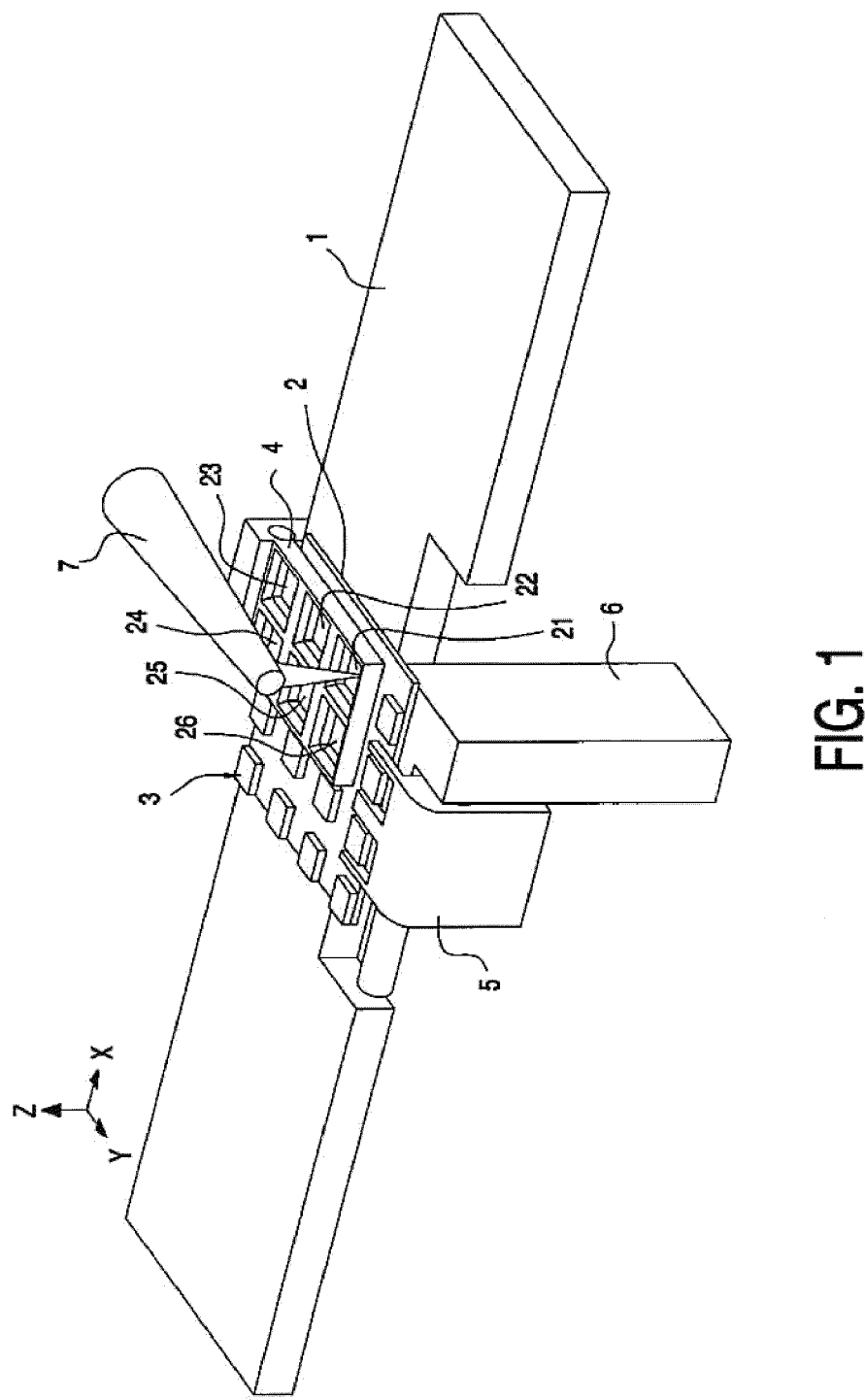

The present invention relates to a method and apparatus for wirebonding leads of a plurality of lead frames being part of a lead frame assembly by a wirebonding tool to semiconductor products mounted on the respective lead frames, the lead frame assembly being indexable in an index direction relative to a wirebonding frame, a first clamp and a second clamp clamping the leads of adjacent lead frames during wirebonding. Within the scope of this invention, a leadframe assembly may be an endless strip or a strip or film having a discrete length. Each of said strips or film comprises at least two parallel rows of lead frames.

In the manufacture of electronics, semiconductor products such as Integrated Circuit (IC) dies or chips are prepared. These semiconductor products are to be accommodated in a package and need to be electrically connectable to components outside the package. For this purpose, a plurality of semiconductor products is first mounted on lead frames in a so-called die bonding process. Next, each semiconductor product is electrically connected to the associated lead frame in a so-called wirebonding process before packaging the semiconductor product. In the wirebonding process, bond pads on one or more surfaces of each semiconductor product are electrically and mechanically connected to leads of the associated lead frame by thin metallic wires, using a wirebonding tool.

The process of wirebonding one semiconductor product on a lead frame generally requires several steps including, in a working area of a wirebonding apparatus, positioning the lead frame relative to a clamping mechanism, operating different clamping elements, operating the wirebonding tool(s), and indexing the lead frame for bringing a new semiconductor product and associated leads of the lead frame into the working area of the wirebonding apparatus.

U.S. Pat. No. 6,068,174 discloses a wirebonding apparatus including a heat block or other base member for supporting a lead frame during wirebonding. Separate sets of leads of the lead frame associated with a particular semiconductor product are fixedly held against the heat block by different clamping elements of a clamping mechanism, whereby separate sets of leads are wire bonded by a wirebonding tool at different times.

A problem arises in the time required for indexing the lead frame, during which the bonding tool must be inoperative. A relative long lead frame indexing time, or many indexing operations for a lead frame, will lead to a relative low throughput of the wirebonding apparatus. Consequently, a reduction of the lead frame indexing time in which the bonding tool must be inoperative will lead to an increase in the throughput of the wirebonding apparatus.

U.S. Pat. No. 5,322,207 discloses an automated wirebonding apparatus wherein a single indexing step for the lead frame enables two or more semiconductor products to be wirebonded, before a next lead frame indexing step is to be taken, which results in a decrease of the overall time for wirebonding all semiconductor products on the lead frame, and thus in a decrease of the mean wirebonding cycle time per semiconductor product.

However, a need exists in the field of wirebonding to further reduce the mean wirebonding cycle time per semiconductor product.

It is an object of the present invention to provide a wirebonding method and apparatus having an increased throughput by decreasing the time delay caused by the indexing of the lead frame assembly.

This object is reached in the method according to the invention for wirebonding leads of a plurality of lead frames being part of a lead frame assembly by a wirebonding tool to semiconductor products mounted on the respective lead frames, the lead frame assembly being indexable in an index direction relative to a wirebonding frame, and comprising a first row and an adjacent second row of lead frames as seen in the index direction, the lead frames being spaced from each other at a lead frame pitch in the index direction, the method comprising the steps of:

(a) clamping the leads of n ($n \geq 1$) adjacent lead frames of the first row by a first clamp, and wirebonding the leads of the n lead frames of the first row to the corresponding semiconductor products;
(b) clamping the leads of n adjacent lead frames of the second row by a second clamp, and wirebonding the leads of the n lead frames of the second row to the corresponding semiconductor products;
(c) releasing the first clamp after step (a);
(d) indexing the lead frame assembly over n lead frame pitches relative to the wirebonding frame after step (a), the second clamp and the wirebonding tool following the index movement;
(e) releasing the second clamp after step (b);
(f) moving the second clamp opposite to the indexing direction over n lead frame pitches; and
(g) repeating steps (a)-(f).

The provision of a preferably stationary (as seen in the index direction) first clamp and a movable (as seen in the index direction) second clamp allows for performing a wirebonding process during an indexing operation, thus removing the lead frame assembly indexing time from the critical time path of the apparatus. The first clamp and the second clamp each comprise a clamping frame being movable towards and away from the semiconductor product on the associated lead frame, and a base member being movable towards and away from the lead frame at the side facing away from the semiconductor product.

In the method according to the invention, the steps (a)-(g) are not performed in succession, i.e. in general a next step will not be taken only when the previous step is completed. Some steps may be taken in parallel, as will be explained hereafter.

The clamping of the second clamp according to step (b) may be initiated concurrently with the initiation of the clamping of the first clamp according to step (a), but may also be later in time. In practice, the initiation of the clamping of the second clamp will be at any moment during the clamping time of the first clamp, before the first clamp is released. The first clamp may be released immediately after completing step (a), i.e. after completing the wirebonding of the leads of the n-th lead frame of the n lead frames clamped by the first clamp, but this release may also be later in time, during the clamping time of the second clamp. Anyway, the release of the first clamp should be completed before step (d) is initiated.

During the indexing of the lead frame assembly according to step (d), the leads of n adjacent lead frames of the second row of lead frames is still are still clamped by the second clamp to the second base member. The wirebonding of the leads of the n lead frames of the second row of lead frames by the wirebonding tool according to step (b) is continued during the indexing step (d), resulting in the indexing not interrupting the wirebonding, thus decreasing the mean semiconductor wirebonding cycle time.

The second clamp may be released immediately after completing step (b), i.e. after completing the wirebonding of the leads of the n-th lead frame of the n lead frames clamped by the second clamp, but this release may also be later in time, e.g. during the clamping time of the first clamp.

Moving the second clamp back to its previous position relative to the wirebonding frame according to step (f) can only be performed after step (e) is completed. Step (f) should be completed before, in a repetition of steps (a)-(f), step (b) is performed again.

In a repetition of steps (a)-(f), step (a) can be initiated as soon as steps (b) and (d) are completed.

Preferably, the number n is 2 for an optimum path with the shortest route of the wirebonding tool across the lead frames of the first row and the second row. However, the number n may also be greater than 2, although this would result in at least one longer part of the path of the wirebonding tool when moving from the last lead frame of the first row to the first lead frame of the second row or vice versa.

Preferably, after step (f) in the method according to the invention the n lead frames of the first row lead one lead frame pitch relative to the n lead frames of the second row, as seen in the index direction. In such a situation, in particular when n=2, the shortest paths for the wirebonding tool across the lead frame assembly are achieved.

Using lead frame assemblies having more than two rows of lead frames, in particular at least one further row of lead frames adjacent to the first row at the side facing away from the second row of lead frames, the first clamp in step (a) preferably further clamps n lead frames of the further row adjacent the n lead frames of the first row. Similarly, when a lead frame assembly is used with at least one further row of lead frames adjacent to the second row at the side facing away from the first row of lead frames, the second clamp in step (b) preferably further clamps n lead frames of the further row adjacent the n lead frames of the second row. In particular when n is even, an optimum meandering wirebonding path can be followed by the wirebonding tool across the lead frames of the first and further row(s), and the lead frames of the second and further row(s), clamped by the first and second clamp, respectively.

In a preferred embodiment having a simple construction, the first clamp is stationary relative to the wirebonding frame, as seen in the index direction.

A wirebonding apparatus according to the present invention for wirebonding leads of a plurality of lead frames being part of a lead frame assembly to semiconductor products mounted on the respective lead frames, comprises: a wirebonding frame; an indexing device for indexing the lead frame assembly in an index direction relative to the wirebonding frame; at least a first clamp for clamping the leads of n (n≧1) adjacent lead frames of a first row of lead frames as seen in the index direction, the first clamp being stationary in the index direction relative to the wirebonding frame; at least a second clamp for clamping the leads of n adjacent lead frames of a second row of lead frames adjacent the first row, the second clamp being movable in the index direction relative to the wirebonding frame; and a wirebonding tool for wirebonding the leads of the n lead frames of the first and the second row to the corresponding semiconductor products, the wirebonding tool and the second clamp being adapted for following the index movement of the lead frame assembly. The wirebonding tool is preferably adapted to perform a wirebonding operation during the movement of the second clamp.

In a preferred arrangement providing a high degree of flexibility of clamp design, the first clamp and the second clamp are situated generally opposite to each other, as seen transversely to the index direction.

The above and other claims, features and advantages of the invention are explained in more detail below by reference to the appended Figures, showing a non-limiting exemplary embodiment.

FIGS. 1-6 in a perspective view schematically illustrate consecutive steps in a wire-bonding operation.

In the different Figures, identical reference numerals indicate identical parts or parts having the same function. For ease of explanation, the Figures are provided with a diagram indicating an X, Y and Z direction.

FIGS. 1-6 show a wirebonding frame 1 being part of a wire bonding apparatus (not shown in further detail). A lead frame assembly 2, of which only a part is shown in the Figures, comprises several rows (four rows, as seen in the X direction, in the example shown) of lead frames (not shown in detail) carrying semiconductor products 3 which are mounted in a regular arrangement. As seen in each row of semiconductor products 3, the (centre-to-centre) distance between adjacent semiconductor products 3 is indicated with "pitch". The lead frame assembly 2 may be of an arbitrary design, comprising leads (not shown in detail) in a configuration suitable for a particular semiconductor package. The semiconductor products 3 are provided with bond pads (not shown in detail) which are to be connected to the leads of the lead frames of the lead frame assembly 2 by wirebonding as known in the art.

The wirebonding apparatus includes a clamping mechanism comprising a stationary clamp 4 extending over part of the area of the lead frame assembly 2 so as to clamp leads associated with at least two adjacent semiconductor products 3 in a row in one or more adjacent rows against a heat block or other base member (not shown). In the embodiment shown in FIGS. 1-6, the stationary clamp 4 is adapted to clamp two adjacent semiconductor products 3 in three adjacent rows, i.e. a total of six semiconductor products 2, by means of suitable clamping elements (not shown). Such clamping elements may take any suitable shape, e.g. fingers, brackets, or blocks. The adjective "stationary" is used here to indicate that the stationary clamp 4 is not movable in the indicated X and Y direction with respect to the wirebonding frame 1 of the wirebonding apparatus on which the stationary clamp 4 is mounted. However, at least part of the stationary clamp 4 comprising the clamping elements is movable in the Z direction between a first end position in which the leads of the lead frames under the stationary clamp 4 are clamped against said heat block or other base member, and a second end position in which the leads of the lead frames under the stationary clamp 4 are not clamped, providing the opportunity to move the lead frame assembly 2 in the X direction relative to the stationary clamp 4.

The clamping mechanism of the wirebonding apparatus further comprises a movable clamp 5 extending over part of the area of the lead frame assembly 2 so as to clamp leads associated with at least two adjacent semiconductor products 3 in a row in one or more adjacent rows against a heat block or other base member. In the embodiment shown in FIGS. 1-6, the movable clamp 5 is adapted to clamp two adjacent semiconductor products 3 in one row, i.e. a total of two semiconductor products 3, by means of suitable clamping elements. The adjective "movable" is used here to indicate that the movable clamp 5 is movable in the indicated X direction with respect to the wirebonding frame 1 of the wirebonding apparatus on which the movable clamp 5 is mounted. Additionally, at least part of the movable clamp 5 comprising the clamping elements is movable in the Z direction between a first end position in which the leads of the lead frames under the movable clamp 5 are clamped against a heat block or other base member, and a second end position in which the leads of the lead frames under the movable clamp 5 are not clamped, providing the opportunity to move the lead frame assembly 2 in the X direction relative to the movable clamp 5.

The stationary clamp 4 and the movable clamp 5 are situated generally opposite to each other, at opposite sides of the lead frame assembly 2.

The movable clamp 5 is coupled to an index mechanism 6 such that with a displacement of the lead frame assembly 2 by the index mechanism 6 over a predetermined distance in the X direction also the movable clamp 5 moves over the same distance in the X direction.

In FIGS. 1-6, at least one bonding head 7 having a drive mechanism (not shown) is operable.

The operation of the wirebonding apparatus comprising the stationary clamp 4, the movable clamp 5, the index mechanism 6, and the at least one wirebonding head 7 is now explained with reference to FIGS. 1-6.

Figure 2:
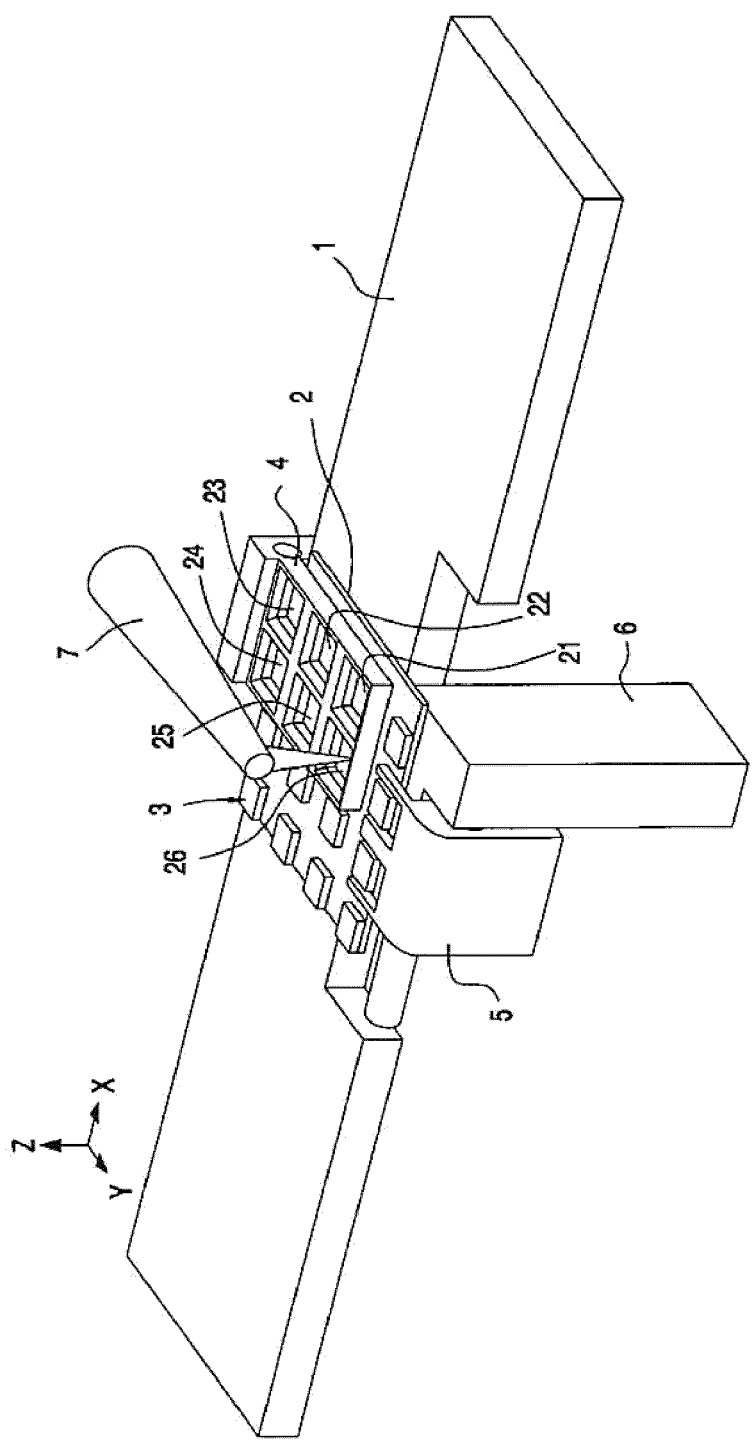

In a first phase of a wirebonding process performed by the wirebonding apparatus, semiconductor products 21, 22, 23, 24, 25, and 26 are clamped by the stationary clamp 4 in its first end position, and the semiconductor products 21-26 are wirebonded consecutively, as indicated in FIGS. 1 and 2 illustrating the wirebonding of the first one and the last one of the semiconductor products 21-26, respectively.

Figure 3:
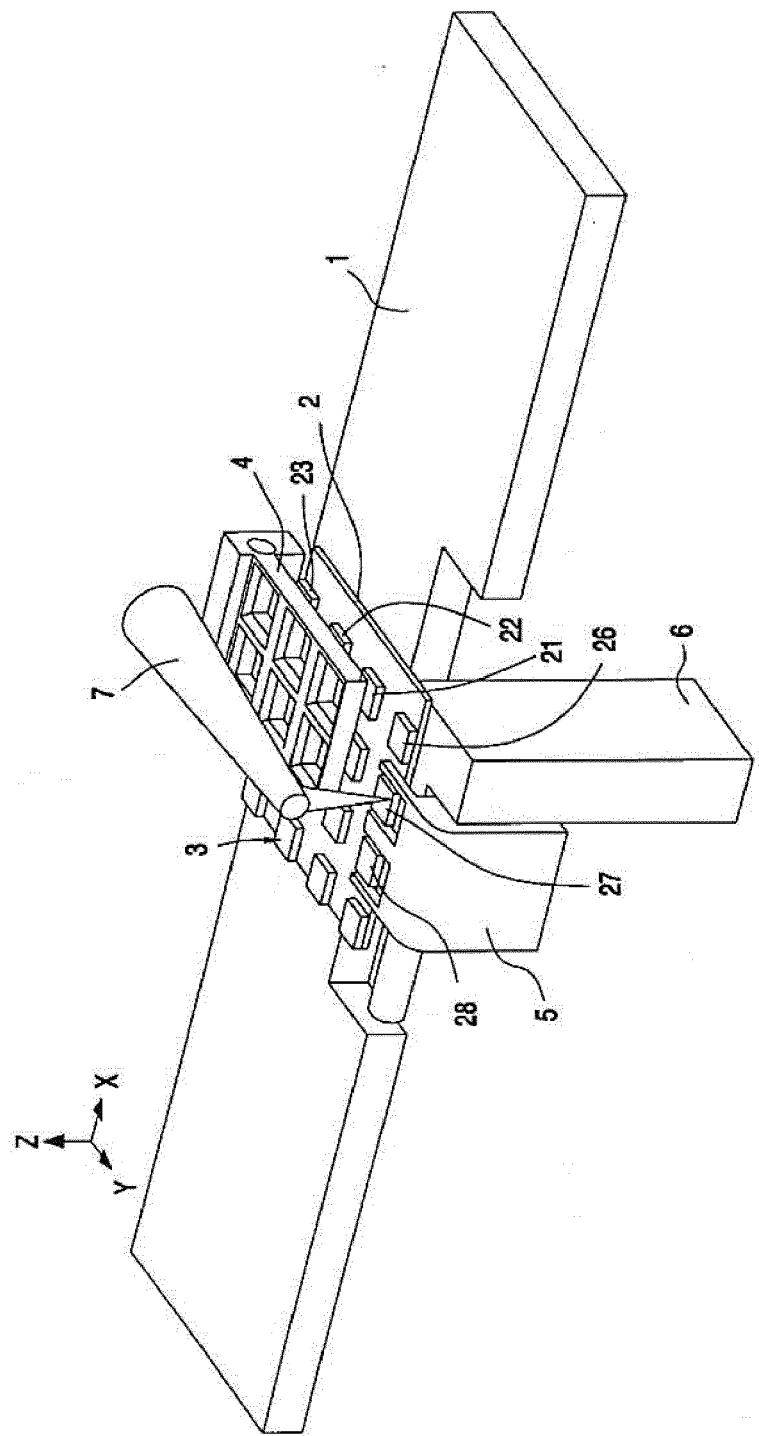

As illustrated in FIG. 3, after the semiconductor products 21-26 have been wirebonded, the stationary clamp 4 releases the lead frame assembly 2 by moving in the Z direction to its second end position.

At this moment, or earlier in time, the semiconductor products 27, and 28 are clamped with the movable clamp 5 in its first end position.

Figure 4:
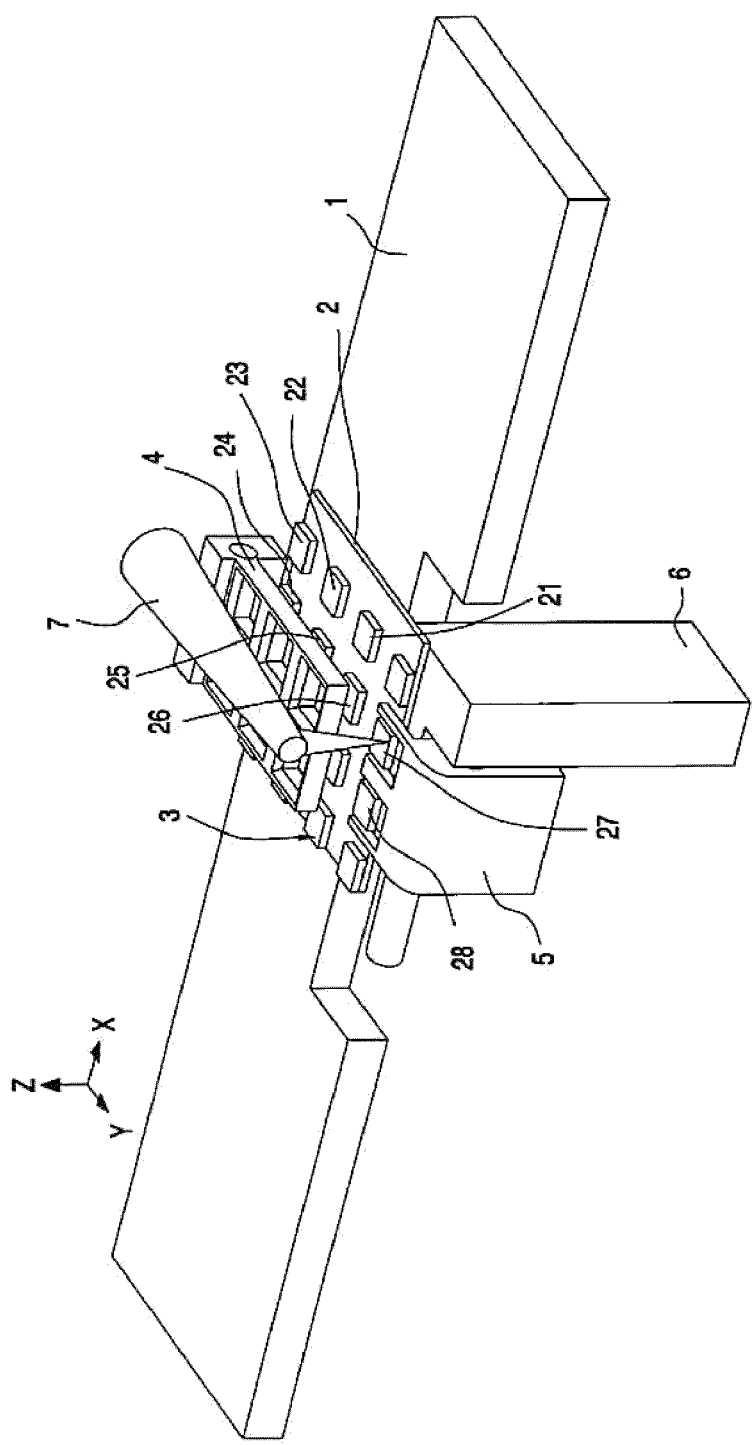
Figure 5:
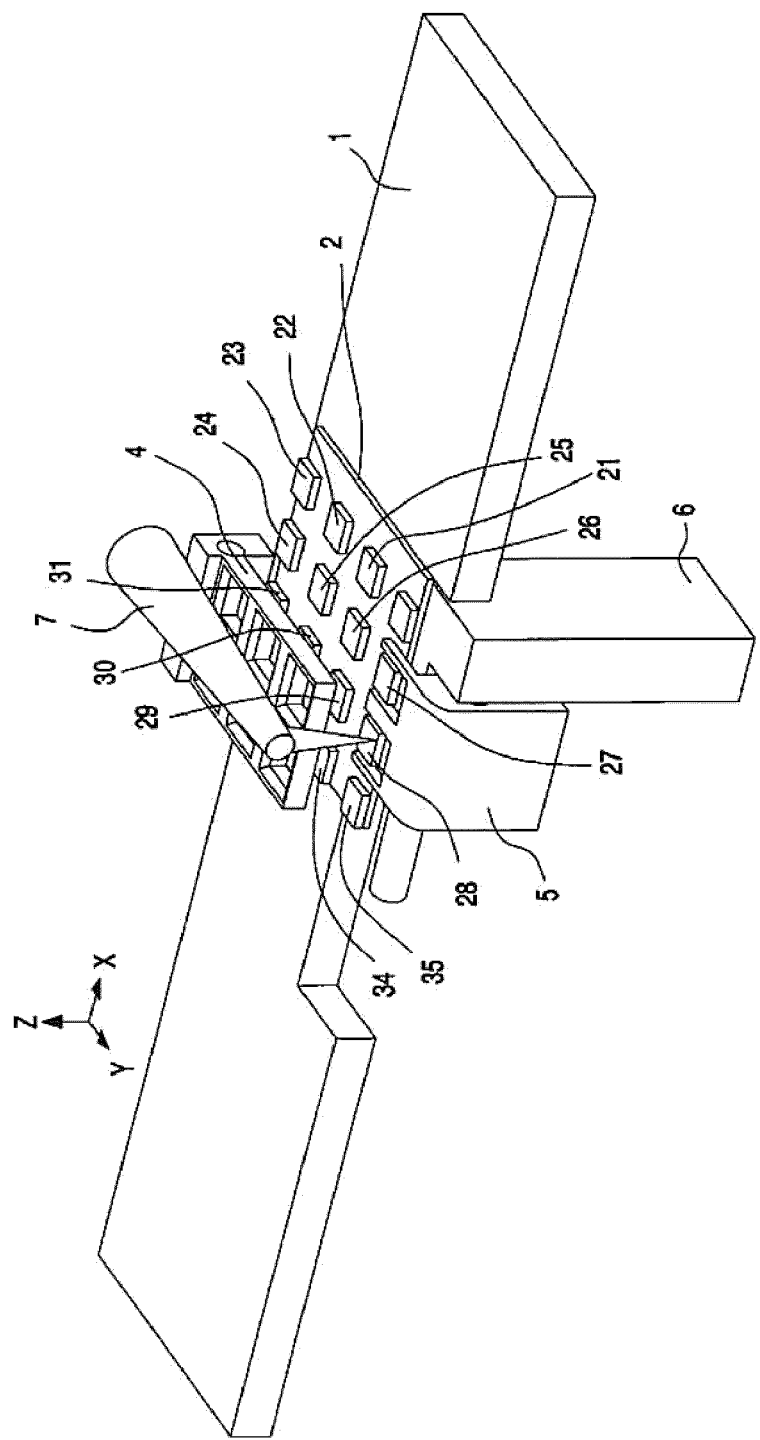

As illustrated in FIGS. 4 and 5, the index mechanism 6 then indexes the lead frame assembly 2 over twice the pitch of the semiconductor products 3 in the X direction. The movable clamp 5 and the wirebonding tool 7 follow the indexing movement of the indexing mechanism 6 by a suitable mechanical or electrical coupling therebetween, in particular between their respective (servo) drive motors. Meanwhile, the semiconductor products 27 and 28 are wirebonded.

Figure 6:
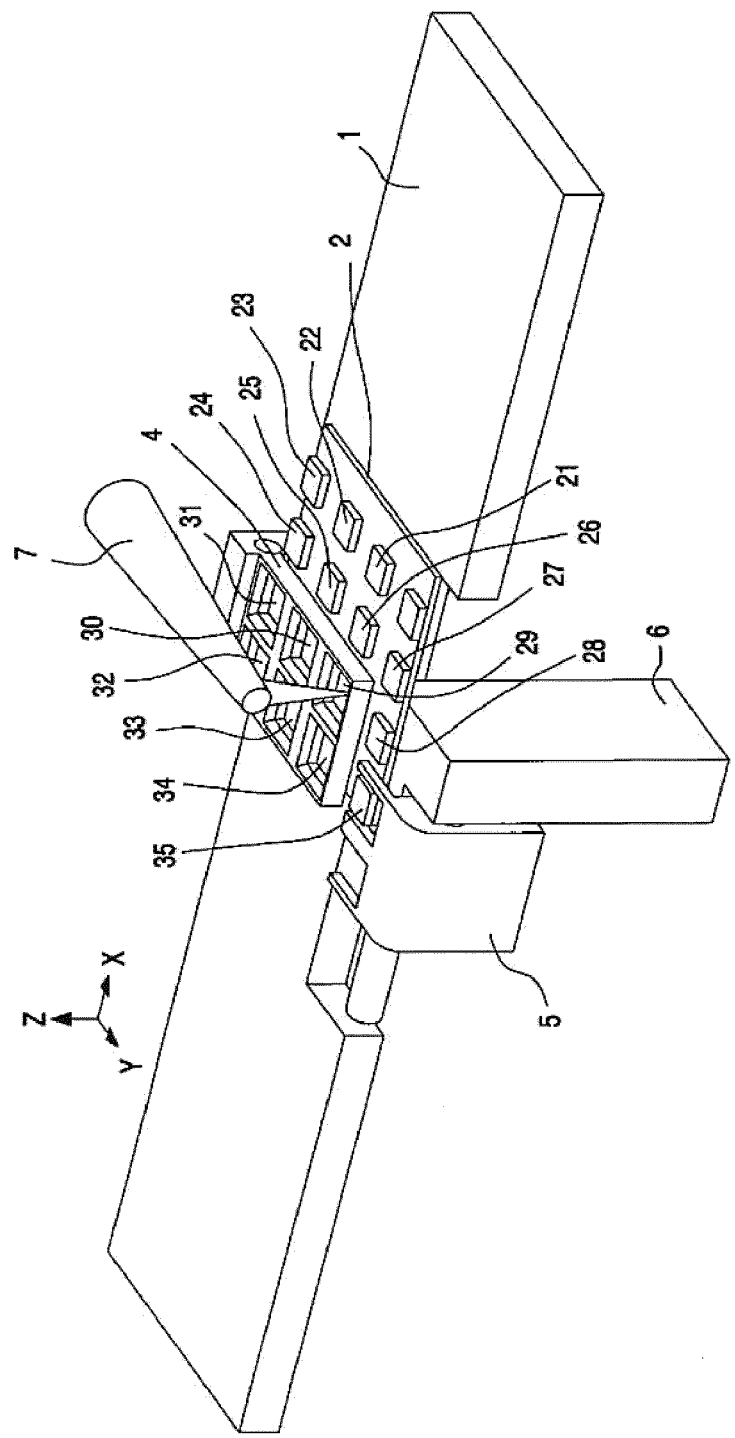

As illustrated in FIG. 6, next the lead frame assembly 2 is clamped by moving the stationary clamp 4 in the Z direction to its first end position. As a result, semiconductor products 29, 30, 31, 32, 33 and 34 are clamped, and the semiconductor products 29-34 are wirebonded consecutively.

Meanwhile, the movable clamp 5 releases the lead frame assembly 2 by moving in the Z direction to its second end position. The index mechanism 6 then moves back to its former position relative to the wirebonding frame 1 of the wirebonding apparatus, taking the movable clamp 5 along, but without displacing the lead frame assembly 2. The movable clamp 5 then clamps leads and semiconductor product 35 and an adjacent semiconductor product not shown in FIG. 6 by moving in the Z direction to its first end position, after which the clamped semiconductor products can be wirebonded.

Thus, the situation of FIG. 1 is obtained again, and a new cycle of wirebonding can be completed. These cycles can be repeated for as long as semiconductor products on the lead frame assembly 2 remain to be wirebonded.

As a further example, consider the situation in which the lead frame assembly comprises only two rows of lead frames carrying semiconductor products e.g. a row comprising semiconductor products 26, 29 and 34, and a row comprising semiconductor products 27, 28, and 35. Further assume that both the stationary clamp and the movable clamp are adapted to clamp only one semiconductor product at the time. In such a situation the operational order of wirebonding would be semiconductor products 26, 27, 29, 28, 34, 35, etc., where the movable clamp would follow an indexing of the lead frame assembly over one pitch of the semiconductor products during the wirebonding of semiconductor products 27, 28, 35, etc.

As another example, consider again the situation in which the lead frame assembly comprises only two rows of lead frames carrying semiconductor products e.g. a row comprising semiconductor products 26, 29 and 34, and a row comprising semiconductor products 27, 28, and 35. If both the stationary clamp and the moving clamp would be adapted to clamp two adjacent semiconductor products in a row at the time, the operational wirebonding order would be semiconductor products 21, 26, 27, 28, 29, 34, 35, etc., where the movable clamp would follow an indexing of the lead frame assembly over two pitches of the semiconductor products during the wirebonding of at least one of semiconductor products 27, 28, 35, etc.

From FIGS. 1-6 it will be clear that a meandering wirebonding path may followed over and across the lead frame assembly 2 by the wirebonding tool 7 for a minimum bonding time to be realized. However, other paths may be followed as well. The indexing of the lead frame assembly 2 is performed during the wirebonding process, which thus does not need to be interrupted for the indexing.

More than one bonding tool 7 may be employed.

According to the above, a wirebonding method and apparatus have been disclosed in which the lead frame assembly indexing time is virtually taken out of the critical time path of the wirebonding process by using a clamping mechanism comprising a stationary clamp and a movable clamp.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. Wirebonding apparatus for wirebonding leads of a plurality of lead frames being part of a lead frame assembly to semiconductor products mounted on the respective lead frames, the apparatus comprising:
   a wirebonding frame;
   an indexing device for indexing the lead frame assembly in an index direction relative to the wirebonding frame;
   at least a first clamp configured to concurrently clamp the leads of n, wherein n is greater than 1, adjacent lead frames of a first row of lead frames as seen in the index direction, the first clamp being stationary in the index direction relative to the wirebonding frame;
   at least a second clamp configured to clamp the leads of n adjacent lead frames of a second row of lead frames adjacent the first row, the second clamp being movable in the index direction relative to the wirebonding frame;
   a wirebonding tool for wirebonding the leads of the n lead frames of the first and the second row to the corresponding semiconductor products, the wirebonding tool and the second clamp being adapted for following the index movement of the lead frame assembly; and
   wherein the first clamp and the second clamp are situated so that the first and second clamps do not clamp lead frames in the same row.

2. Wirebonding apparatus according to claim 1, wherein the wirebonding tool is adapted to perform a wirebonding operation during the movement of the second clamp.

3. Wirebonding apparatus according to claim 1, wherein the first clamp and the second clamp are situated generally opposite to each other, as seen transversely to the index direction.

4. Wirebonding apparatus according to claim 2, wherein the first clamp and the second clamp are situated generally opposite to each other, as seen transversely to the index direction.

5. Wirebonding apparatus according to claim 1, wherein the second clamp clamps the leads of n adjacent lead frames, where n>1.

6. Wirebonding apparatus according to claim 1, wherein the second clamp further clamps leads of a third row of lead frames adjacent to the second row of lead frames.

* * * * *